(12) United States Patent
Yu et al.

(10) Patent No.: US 10,250,816 B2
(45) Date of Patent: Apr. 2, 2019

(54) IMAGE CAPTURE CONTROL METHODS AND APPARATUSES

(71) Applicant: BEIJING ZHIGU RUI TUO TECH CO., LTD., Beijing (CN)

(72) Inventors: Kuifei Yu, Beijing (CN); Lin Du, Beijing (CN)

(73) Assignee: Beijing Zhigu Rui Tuo Tech Co., Ltd., Beijing (CN)

( * ) Notice: Subject to any disclaimer, the term of this patent is extended or adjusted under 35 U.S.C. 154(b) by 69 days.

(21) Appl. No.: 15/520,158

(22) PCT Filed: Oct. 10, 2015

(86) PCT No.: PCT/CN2015/091636
§ 371 (c)(1),
(2) Date: Apr. 19, 2017

(87) PCT Pub. No.: WO2016/066006
PCT Pub. Date: May 6, 2016

(65) Prior Publication Data
US 2017/0318232 A1  Nov. 2, 2017

(30) Foreign Application Priority Data

Oct. 28, 2014  (CN) .......................... 2014 1 0588675

(51) Int. Cl.
*H04N 5/243* (2006.01)
*H04N 5/232* (2006.01)
(Continued)

(52) U.S. Cl.
CPC ........... *H04N 5/243* (2013.01); *G06T 7/0002* (2013.01); *G06T 7/248* (2017.01);
(Continued)

(58) Field of Classification Search
CPC .... H04N 5/243; H04N 5/2351; H04N 5/3696; H04N 5/23254; H04N 5/235;
(Continued)

(56) References Cited

U.S. PATENT DOCUMENTS 8,248,499 B2 *  8/2012  Sutton ................. G02B 3/0037
                                                  348/294
9,570,488 B2 *  2/2017  McKnight ......... H01L 27/14607
(Continued)

FOREIGN PATENT DOCUMENTS

CN        1792089 A     6/2006
CN      101385334 A     3/2009
(Continued)

OTHER PUBLICATIONS

International Search Report and Written Opinion for Application No. PCT/CN2015/091636, dated Jan. 12, 2016, 8 pages.
(Continued)

*Primary Examiner* — Nhan T Tran
(74) *Attorney, Agent, or Firm* — Sheppard, Mullin, Richter & Hampton LLP

(57) ABSTRACT

Embodiments of the present application disclose various image capture control methods and apparatuses. One of the image capture control methods comprises: determining a first zone as an allowable image blur zone, the first zone being a part of a shooting scene; determining a first imaging region that corresponds to the allowable image blur zone in an image sensor; adjusting a first pixel density distribution of the first image sensor, to cause the first pixel density of the imaging region to be lower than a second pixel density of a second imaging region in the image sensor after being adjusted; and performing, by using the image sensor after being adjusted, image capture on the shooting scene. In the embodiments of the present application, pixel waste possi-
(Continued)

bly caused by image capture of an allowable image blur zone in a shooting scene may be reduced, so as to fully utilize pixel resources of the image sensor to improve imaging quality of a second zone in the shooting scene, thereby better satisfying a user's diversified actual application demands.

28 Claims, 8 Drawing Sheets

(51) Int. Cl.
| | |
|---|---|
| *H04N 5/235* | (2006.01) |
| *H04N 5/369* | (2011.01) |
| *H01L 27/146* | (2006.01) |
| *G06T 7/246* | (2017.01) |
| *G06T 7/00* | (2017.01) |

(52) U.S. Cl.
CPC .. *H01L 27/14601* (2013.01); *H01L 27/14603* (2013.01); *H04N 5/235* (2013.01); *H04N 5/2351* (2013.01); *H04N 5/23254* (2013.01); *H04N 5/3696* (2013.01); *G06T 2207/10028* (2013.01); *G06T 2207/10152* (2013.01); *G06T 2207/30168* (2013.01)

(58) Field of Classification Search
CPC ............... G06T 7/0002; G06T 7/248; G06T 2207/10152; G06T 2207/10028; G06T 2207/30168; H01L 27/14601; H01L 27/14603
See application file for complete search history.

(56) References Cited

U.S. PATENT DOCUMENTS

| | | | | |
|---|---|---|---|---|
| 2004/0145668 | A1* | 7/2004 | Iwasawa | H04N 5/3456 348/301 |
| 2006/0119903 | A1* | 6/2006 | Chiba | H04N 5/23212 358/474 |
| 2006/0256227 | A1 | 11/2006 | Gotzig | |
| 2008/0151089 | A1 | 6/2008 | Street et al. | |
| 2009/0059031 | A1 | 3/2009 | Miyakoshi | |
| 2010/0164038 | A1* | 7/2010 | Choi | H01L 27/14601 257/432 |
| 2011/0310125 | A1 | 12/2011 | McEldowney et al. | |
| 2012/0049067 | A1* | 3/2012 | Takahashi | G01J 5/02 250/338.2 |
| 2012/0229688 | A1 | 9/2012 | Tajiri | |
| 2012/0261551 | A1* | 10/2012 | Rogers | G02B 3/14 250/208.1 |
| 2016/0086994 | A1* | 3/2016 | Guenter | H01L 27/14625 250/206 |
| 2017/0041620 | A1 | 2/2017 | Du et al. | |
| 2017/0229523 | A1 | 8/2017 | Du | |

FOREIGN PATENT DOCUMENTS

| | | |
|---|---|---|
| CN | 102201422 A | 9/2011 |
| CN | 102332090 A | 1/2012 |
| CN | 102437168 A | 5/2012 |
| CN | 102685377 A | 9/2012 |
| CN | 103473044 A | 12/2013 |
| CN | 103927767 A | 7/2014 |
| CN | 104159025 A | 11/2014 |
| CN | 104486555 A | 4/2015 |
| JP | 2006129411 A | 5/2006 |

OTHER PUBLICATIONS

Bar-Cohen, Y. "Electroactive polymers for refreshable Braille displays," SPIE, Sep. 11, 2009.

Ko, H. et al., "A hemispherical electronic eye camera based on compressible silicon optoelectronics," Nature, 2008, 454,7205, p. 748-753.

Ng, T et al., "Flexible image sensor array with bulk heterojunction organic photodiode," Applied Physics Letters, 2008, vol. 92, p. 213303.

Yanlei Yu, M. et al., "Photomechanics: Directed bending of a polymer film by light," Nature, Sep. 2003, vol. 425, No. 145.

* cited by examiner

IMAGE CAPTURE CONTROL METHODS AND APPARATUSES

CROSS-REFERENCE TO RELATED APPLICATIONS

This application is a National Phase Application of International Application No. PCT/CN2015/091636, filed on Oct. 10, 2015, which claims the benefit of priority to Chinese Patent Application No. 201410588675.2, filed on Oct. 28, 2014, and entitled "Image Capture Control Methods and Apparatuses", each of which is incorporated in the present application by reference herein in its entirety.

TECHNICAL FIELD

The present application relates to the field of image processing technologies, and in particular, to various image capture control methods and apparatuses.

BACKGROUND

New image capture technologies and devices are continuously being developed in response to people's increasing demands. During the process of image capture, one or more causes such as having moving objects or insufficient partial lighting may affect an imaging quality of a captured image.

SUMMARY

The following briefly describes the present application, so as to provide a basic understanding of some aspects of the present application. It should be understood that, the brief description is not an exhaustive brief description of the present application. The description is neither intended to determine key or important parts of the present application, nor intended to limit the scope of the present application. An objective thereof is merely to give some concepts in a simplified manner as a preface for more detailed description hereinafter.

The present application provides various image capture control methods and apparatuses.

In one aspect, an embodiment of the present application provides an image capture control method, comprising:

determining a first zone as an allowable image blur zone, the first zone being a part of a shooting scene;

determining a first imaging region that corresponds to the allowable image blur zone in an image sensor;

adjusting pixel density distributions of the image sensor, to cause a first pixel density of the first imaging region to be lower than a second pixel density of a second imaging region in the image sensor after being adjusted; and performing, by using the image sensor after being adjusted, image capture on the shooting scene.

In another aspect, an embodiment of the present application further provides an image capture control apparatus, comprising:

an allowable image blur zone determining module, configured to determine a first zone as an allowable image blur zone, the first zone being a part of a shooting scene;

an imaging region determining module, configured to determine an imaging region that corresponds to the allowable image blur zone in an image sensor;

a pixel density distribution adjustment module, configured to adjust pixel density distributions of the image sensor, so as to cause a first pixel density of the first imaging region to be lower than a second pixel density of a second imaging region in the image sensor after being adjusted; and an image capture module, configured to perform, by using the image sensor after being adjusted, image capture on the shooting scene.

According to the technical solutions provided by embodiments of the present application, a part of a shooting scene is determined as an allowable image blur zone, based on which pixel density distribution of an image sensor is adjusted. In the image sensor after being adjusted, a pixel density of an imaging region that corresponds to the allowable image blur zone is lower than that of another region in the image sensor. In this way, a part of pixels of an image sensor that are used for capturing an allowable image blur zone of a shooting scene may be adjusted to capture an image of another zone of the shooting scene, so as to reduce pixel waste possibly caused by image capture of the allowable image blur zone of the shooting scene, and cause the image sensor after being adjusted to have more pixels used for capturing an image of another zone of the shooting scene, thereby fully utilizing pixel resources of the image sensor to improve imaging quality of another zone in the shooting scene under a condition of meeting an imaging requirement for the allowable image blur zone, improving pixel utilization of the image sensor, and better satisfying a user's diversified actual application demands.

The following describes in detail alternative embodiments of the present application with reference to accompanying drawings, to make these and other advantages of the present application more obvious.

BRIEF DESCRIPTION OF THE DRAWINGS

The present application may be understood better with reference to the following description in combination with accompanying drawings, wherein a same or similar accompanying drawing mark is used in all the accompanying drawings to represent a same or similar component. The accompanying drawings together with the following detailed description are comprised in the specification and constitute a part of the specification, and are used to further illustrate alternative embodiments of the present application and explain the principle and advantages of the present application. In the accompanying drawings.

A person skilled in the art should understand that, elements in the accompanying drawings are merely shown for simplicity and clarity, and are not necessarily drawn to scale. For example, in the accompanying drawings, the size of an element may be enlarged relative to another element, so as to facilitate enhancing an understanding of the embodiments of the present application.

DETAILED DESCRIPTION

The following will describe in details illustrative embodiments of the present application with reference to accompanying drawings. For the purpose of clear and brief description, the specification does not describe all features of practical implementation manners. However, it should be understood that, many decisions specific to the implementation manners must be made during development of any one of the practical embodiments, so as to achieve a specific objective of a developer, for example, conformance to restrictive conditions related with a system and service, wherein the restrictive conditions may vary with different implementation manners. In addition, it should also be understood that, although development work may be very complex and time-consuming, for a person skilled in the art that benefits from the content of the present disclosure, the development work is only a routine task.

Another point that should be noted here is, to avoid the present application from being not clearly understood due to unnecessary details, the accompanying drawings and specification merely describe apparatus structures and/or processing steps closely related to the solutions of the present application, but omit the representation and description of parts and processing that have little relation with the present application, and have been known by a person of ordinary skill in the art.

The following further describes in detail specific implementation manners of the present application with reference to the accompanying drawings (a same label represents a same element in several accompanying drawings) and embodiments. The following embodiments are used to describe the present application, but are not intended to limit the scope of the present application.

A person skilled in the art may understand that, terms such as "first" and "second" in the present application are merely used to distinguish different steps, devices or modules, which neither represent any specific technical meaning, nor represent a necessary logic sequence among them.

Figure 1A:
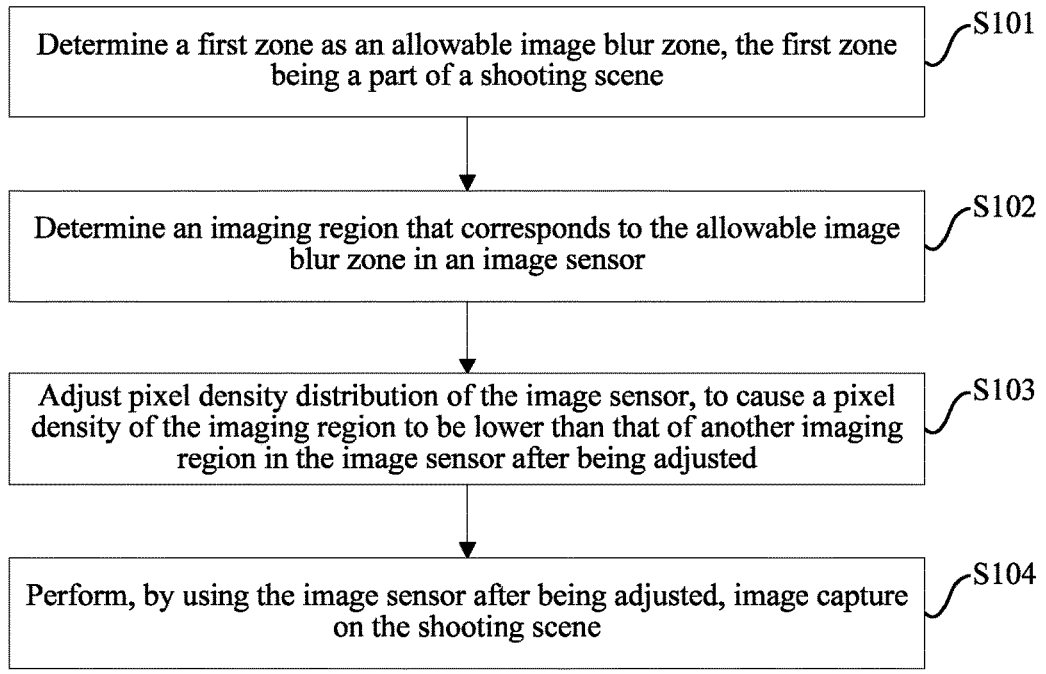
FIG. 1a is a flowchart of an image capture control method, according to an embodiment of the present application.

FIG. 1a is a flowchart of an image capture control method according to an embodiment of the present application. The image capture control method provided by this embodiment of the present application may be executed by an image capture control apparatus, wherein the image capture control apparatus can perform control over capture of a static or dynamic image by using the image capture control method during an application procedure, comprising but not limited to: photo taking, camera shooting, photographing, and video monitoring. There is no limit to the manners in which the image capture control apparatus is embodied. For example, the image capture control apparatus may be an independent part, the part cooperating with an image capture device comprising an image sensor in communication; or the image capture control apparatus may be a functional module integrated in an image capture device that comprises an image sensor. The image capture device may comprise but is not limited to an intelligent terminal such as a mobile phone, a camera, a video camera, and another type of image capture device having a camera shooting or photographing function, which is not limited in this embodiment of the present application.

Specifically, as shown in FIG. 1a, an image capture control method provided by this embodiment of the present application comprises:

S101: Determine a first zone as an allowable image blur zone, the first zone being a part of a shooting scene.

The allowable image blur zone may be flexibly determined according to one or more factors such as an imaging quality requirement and a device's capture capability. For example, in practical application of image capture, a part of a shooting scene may be a zone for which a user or device does not expect clear imaging; or a part of a shooting scene may be a zone for which clear imaging cannot be achieved due to insufficient capability of a device; or the like. These zones or another zone similar to these zones may be determined as the allowable image blur zone described in this embodiment of the present application.

S102: Determine an imaging region that corresponds to the allowable image blur zone in an image sensor.

In a scenario of image capture by using an image capture device, there may generally be a certain zooming ratio between the size of a zone within a shooting scene and the size of a corresponding region captured by an image sensor. The zooming ratio is related to factors such as an object distance of a shot object and a focal length of a lens of the image capture device. An imaging region that corresponds to an allowable image blur zone of the scene to be shot may be determined according to the zooming ratio. That is, the determined imaging region is a region in the image sensor that affects imaging of the allowable image blur zone in the shooting scene during the process of image capture.

S103: Adjust pixel density distributions of the image sensor, to cause a pixel density of the imaging region to be lower than that of another imaging region in the image sensor after being adjusted.

In this embodiment of the present application, the image sensor is an image sensor with an adjustable pixel density, which may comprise but is not limited to a flexible image sensor. The flexible image sensor comprises a flexible lining, and a plurality of image sensor pixels formed on the flexible lining, wherein the flexible lining may change such as expand, shrink, or bend when a certain condition is met, so as to adjust pixel density distributions thereof. In this embodiment of the present application, in combination with the feature of the image sensor having adjustable pixel density distribution, pixel density distribution of the image sensor may be adjusted, to cause a pixel density of the imaging region in the image sensor after being adjusted to be lower than that of an imaging region other than the determined imaging region in the image sensor.

S104: Perform, by using the image sensor after being adjusted, image capture on the shooting scene.

As pixel density distribution of the image sensor after being adjusted is uneven, a pixel density that corresponds to the determined imaging region is lower, while a pixel density that corresponds to another imaging region is higher. In this way, during image capture of a shooting scene, less pixels of an image sensor are involved in image capture of the allowable image blur zone of the shooting scene, while more pixels of the image sensor are involved in image capture of at least a part of zones other than the allowable image blur zone of the shooting scene, to cause clearness of a captured entire image to exhibit differentiated distribution. For example, an image part that corresponds to the allowable image blur zone of the shooting scene is blurry, while an image part that corresponds to another zone of the shooting scene is clear.

Generally, an image sensor adopts even pixel density distribution to capture image information of different zones of a shooting scene. However, the inventor of the present application found during implementation of this embodiment of the present application that, a user or a device may have different imaging quality requirements for different zones of a shooting scene. For some zones, an actual imaging quality requirement of a user or device is very low; and for some zones, clear imaging cannot be achieved due to a limit to the performance of an image capture device; and the like. If a great many of pixels are still used to perform image capture on these zones, pixel waste may be caused. Therefore, under a condition of meeting a basic requirement for imaging quality of these zones, redundant pixels may be instead used for capturing an image of another zone in the shooting scene, thereby fully utilizing integral pixels of the image sensor to improve imaging quality of another zone in the shooting scene.

For this purpose, according to the technical solution provided by this embodiment of the present application, a part of a shooting scene is determined as an allowable image blur zone, based on which pixel density distribution of an image sensor is adjusted. A pixel density of an imaging region that corresponds to the allowable image blur zone is lower than that of another region in the image sensor after being adjusted. In this way, a part of pixels of the image sensor that are used for capturing an allowable image blur zone of a shooting scene may be adjusted to capture an image of another zone of the shooting scene, so as to reduce pixel waste possibly caused by image capture of the allowable image blur zone of the shooting scene, and cause the image sensor after being adjusted to have more pixels used for capturing an image of another zone of the shooting scene, thereby fully utilizing pixel resources of the image sensor to improve imaging quality of another zone in the shooting scene under a condition of meeting an imaging requirement for the allowable image blur zone, improving pixel utilization of the image sensor, and better satisfying a user's diversified actual application demands.

In the technical solution provided by this embodiment of the present application, the manner of determining the first zone is very flexible.

In an alternative implementation manner, the image capture control method may comprise: determining, according to at least lighting information of the shooting scene, the first zone. In practical application, lighting information is an important factor that affects the quality of a captured image of the shooting scene. In this solution, a part of a shooting scene may be determined according to lighting information of the shooting scene as the first zone. From the view of imaging quality, image blur is allowed for the first zone when compared with another zone of the shooting scene. As a result, a part of original pixel points of the image sensor that correspondingly capture the first zone may be used to capture an image of another zone of the shooting scene.

For example, a partial area of the shooting scene, for which lighting information comprised in a current image capture control parameter fails to meet a pre-determined lighting requirement, is determined as the first zone. The lighting requirement may be determined according to actual demands. This solution is implemented in a simple manner.

For another example, a partial area of the shooting scene may be determined, for which lighting information comprised in a current image capture control parameter fails to meet a pre-determined lighting requirement; then at least one image capture control parameter of the shooting scene is adjusted; lighting information of the partial area is re-determined based on the image capture control parameter after being adjusted; and in response to a case if the re-determined lighting information still fails to meet the pre-determined lighting requirement, the determined partial area is determined as the first zone. The current image capture control parameter may comprise but is not limited to one or more of the following: shutter open time, aperture size, photosensitivity of pixel points, and flash duration. When lighting information of a partial area of a shooting scene comprised in a current image capture control parameter fails to meet a pre-determined requirement, an image capture control apparatus may adjust one or more of the current image capture control parameters, for example, increase flash duration, improve photosensitivity, and the like, so as to perfect lighting information of the partial area by means of adjusting an image capture control parameter. After parameter adjustment, the image capture control apparatus may re-determine, according to the parameter after being adjusted, imaging quality of the partial area, and re-evaluate lighting information of the partial area. If re-evaluated lighting information of the partial area still fails to meet the pre-determined lighting requirement, it indicates to a certain degree that, the partial area can hardly meet the necessary lighting requirement within the capability limit of the image capture device. Under a certain circumstance, the necessary lighting requirement is hardly met within the capability limit of the image capture device, which shows that it is very difficult to achieve clear imaging of the partial area. Consequently, using a great many of pixels to capture an image of the partial area but still failing to achieve clear imaging is objectively to cause waste of pixel resources. Therefore, a part of pixels in the imaging region of the image sensor that are originally used for capturing the partial area may be used for capturing another zone of the shooting scene, thereby fully utilizing pixel resources of the image sensor to improve imaging quality of the another zone. This solution improves accuracy of determining an allowable image blur zone of the shooting scene.

In another alternative implementation manner, the image capture control method may comprise: determining, according to at least motion information of a shot object of the shooting scene, the first zone. In an actual image capture scenario, if motion of a shot object in a shooting scene exceeds a controllable range, image blur caused by the motion of the shot object may occur in an image captured during the motion process of the shot object, thereby affecting imaging quality of the captured image. In this solution, a part of a shooting scene may be determined according to motion information of a shot object in the shooting scene as the first zone. From the view of imaging quality, image blur is allowed for the first zone when compared with another zone of the shooting scene. Therefore, a part of original pixel points of the image sensor that correspondingly capture the first zone may be used for capturing an image of another zone of the shooting scene.

Specifically, motion information of a shot object in the shooting scene may be acquired; then a motion distance of the shot object within a pre-determined image capture duration is determined according to the motion information; and a zone that corresponds to the motion distance in the shooting scene is determined as the first zone. The pre-determined image capture duration may be the length of time when a shutter remains open during the process of image capture by an image capture device. A possible motion distance within a pre-determined shutter open time may be determined according to motion information such as a motion speed of the shot object. A zone that corresponds to the motion distance is a partial area of the shooting scene that is possibly involved in motion of the shot object. During the process of image capture, due to motion of the shot object, image blur may occur in a formed image of a zone that corresponds to the motion distance. An effect of image blur is sometimes an artistic effect actively pursued by a user or a device, or sometimes a result of failing to achieve clear imaging, or the like. No matter in which case, a partial area of a shot object that corresponds to a possible motion distance of the shot object within a pre-determined image capture duration, may be determined as the first zone in this solution, which is simple and easily implemented.

Optionally, before the determining a zone that corresponds to the motion distance in the shooting scene as the first zone, the method further comprises: determining a relative displacement of the motion distance relative to the image sensor; and comparing the relative displacement with an allowable displacement. Accordingly, the determining a zone that corresponds to the motion distance in the shooting scene as the first zone, comprises: determining, in response to a case if a comparison result shows that the relative displacement exceeds the allowable displacement, a zone that corresponds to the motion distance as the first zone. Generally, during the process of image capture by an image capture device, if motion of a shot object is within a very small range (such as a slight shaking), limitation of factors such as photosensitivity of pixels of the image capture device may not cause a very great impact on clearness of a captured image. Therefore, an allowable displacement may be determined according to an actual requirement for imaging quality such as clearness of a shot object. If a motion distance of a shot object during the process of image capture is greater than or equal to the allowable displacement, a zone that corresponds to the motion distance is determined as the first zone, based on which a pixel density of the image sensor is adjusted subsequently. This solution is favorable to improving accuracy of determining the first zone.

Optionally, the determining a zone that corresponds to the motion distance in the shooting scene as the first zone, may further comprise: adjusting, in response to a case if imaging quality of a zone that corresponds to the motion distance fails to meet a pre-determined imaging quality requirement under current image capture control, at least one image capture control parameter of the shooting scene; re-determining, based on an image capture control parameter after being adjusted, imaging quality of the zone that corresponds to the motion distance; and determining, in response to a case if re-determined imaging quality still fails to meet the imaging quality requirement, the determined partial area as the first zone. The current image capture control parameter may comprise but is not limited to one or more of the following: shutter open time, aperture size, photosensitivity of pixel points, and fill-in light intensity and duration. When lighting information of a partial area of a shooting scene comprised in a current image capture control parameter fails to meet a pre-determined requirement, an image capture control apparatus may adjust one or more of the current image capture control parameters, for example, shorten flash duration, and the like, so as to improve imaging quality of the partial area by means of adjusting an image capture control parameter. After parameter adjustment, the image capture control apparatus may re-determine, according to the parameter after being adjusted, imaging quality of the partial area, and re-evaluate imaging quality of the partial area. If re-evaluated imaging quality of the partial area still fails to meet the pre-determined imaging requirement, it indicates to a certain degree that, the partial area can hardly meet the necessary imaging quality requirement within the capability limit of the image capture device. Under a certain circumstance, the necessary imaging quality requirement such as clearness is hardly met within the capability limit of the image capture device, which shows that it is very difficult to achieve clear imaging of the partial area. Consequently, using a great many of pixels to capture an image of the partial area but still failing to achieve clear imaging is objectively to cause waste of pixel resources. Therefore, a part of pixels of an imaging region that are used for capturing the partial area may be used for capturing another zone of the shooting scene, thereby fully utilizing pixel resources of the image sensor to improve imaging quality of the another zone. This solution improves accuracy of determining an allowable image blur zone of the shooting scene.

In the above technical solution, the manner of acquiring motion information of a shot object in the shooting scene is very flexible, which is not limited in this embodiment of the present application.

For example, an image capture control apparatus may receive motion information of the shot object. That is, the image capture control apparatus acquires motion information of the shot object from the outside. For example, if the shot object is a human body, a wearable device such as a smart band and smart glasses on the human body acquires motion information of the human body by using a motion sensor and sends the motion information to the image capture control apparatus; or the image capture control apparatus may receive through a communications network motion information of the shot object from the outside, such as an image capture device that is not integrated with the image capture control apparatus, another component of an image capture device, or a cloud. In this solution, image capture control may be implemented by fully utilizing interaction of intelligent devices or in a manner such as sharing of motion information of a shot object, so as to improve flexibility of motion information acquiring.

For another example, an image capture control apparatus may acquire motion information of the shot object in a manner of pre-analysis before image capture. For example, the image capture control apparatus may analyze a preview image of the shot object, and acquire, according to an analysis result, motion information of the shot object. The preview image may be a series of images during view finding before an image capture device is formally triggered to perform image capture control. By means of analyzing these images, a rough motion trend of the shot object may be acquired according to an analysis result, that is, motion information of the shot object may be acquired. In this solution, motion information of a shot object is acquired by means of analyzing a preview image of the shot object before formal shooting and estimating a rough motion trend of the shot object, which is simple and easily implemented.

For still another example, an image capture control apparatus may acquire real-time depth information of the shooting scene; and acquire, according to the real-time depth information, motion information of the shot object. Real-time depth information of a shooting scene reflects information on status change of each shot object with the time in the shooting scene. Motion information of a shot object that exhibits a status change in the shooting scene may be determined according to the real-time depth information. Acquired motion information of a shot object in this solution is relatively accurate.

It should be noted that, in this application, lighting information or motion information of a shot object is used as an example for describing an implementation manner of determining a part of a shooting scene as a first zone. However, the foregoing examples are merely specific embodiments of the present application, but shall not be understood as a limit to the essence of the technical solutions of the present application. Enlightened by the foregoing technical solutions, a person of ordinary skill in the art may combine lighting information with motion information of a shot object, or adopt another similar technical solution, for example, determine a partial area out of focus in a shooting scene as the first zone, and the like. The determined first zone is considered as an allowable image blur zone, based on which a pixel density of an image sensor is adjusted, to cause a part of original pixel points that are used for capturing the first zone to be used for capturing an image of another zone of the shooting scene, thereby fully utilizing pixel resources of the image sensor to improve imaging quality of another zone of the shooting scene. The details are not described herein again.

Optionally, the manner of adjusting pixel density distributions of the image sensor is very flexible in this embodiment of the present application.

For example, target pixel density distribution information of the image sensor may be determined, wherein a target pixel density that corresponds to the imaging region is lower than a target pixel density that corresponds to another imaging region in the target pixel density distribution information. Then, pixel density distribution of the image sensor is adjusted according to the target pixel density distribution information. The target pixel density distribution information is generally used for representing a relative expectation of a user or device for imaging clearness of different zones to be captured in a shooting scene. For example, for a region with a high expectation for image clearness of a shooting scene, a target pixel density that corresponds to the region is higher, so as to improve imaging clearness of the part; for a region with a low requirement for image clearness of a shooting scene, the requirement for image quality such as clearness may be appropriately reduced, and a target pixel density that corresponds to the region is lower. Adjustment on pixel density distribution of the image sensor according to the target pixel density distribution information, is equivalent to re-distribution of pixel points of the image sensor. Image capture on a shooting scene based on the image sensor after being adjusted, may cause target pixel densities that correspond to different zones of the shooting scene to vary, so as to reduce pixel waste possibly caused by image capture of the allowable image blur zone, thereby fully utilizing pixel resources of the image sensor to improve imaging quality of another zone of the shooting scene. In the target pixel density distribution information, a target pixel density of the imaging region that is used for image capture of the allowable image blur zone, is lower than a target pixel density of another imaging region that is used for image capture of another zone of the shooting scene, wherein pixel points within the imaging region may be evenly or unevenly distributed, and pixels points within the another imaging region may also be evenly or unevenly distributed, which is not limited in this embodiment of the present application.

Optionally, the image sensor may comprise but is not limited to a flexible image sensor. The flexible image sensor comprises a flexible lining, and a plurality of image sensor pixels formed on the flexible lining, wherein the flexible lining may change such as expand, shrink, or bend when a certain condition is met, so as to adjust pixel density distributions thereof. In this embodiment of the present application, in combination with the feature of the image sensor in respect of adjustable pixel density distribution, pixel density distribution of the image sensor may be adjusted to reduce the number of pixel points within the imaging region, and increase the number of pixel points within the another imaging region.

Optionally, the image sensor may comprise a controllably-deformable material part. Deformation control information of the controllably-deformable material part of the image sensor may be determined according to the target pixel density distribution information, and the controllably-deformable material part is then controlled to deform according to the deformation control information, so as to accordingly adjust pixel density distributions of the image sensor. For the controllably-deformable material part, when an external influencing factor (such as an external field) acting thereon is changed, the controllably-deformable material part can be caused to deform; and when the external field acting thereon is removed or changed, the deformation of the controllably-deformable material part can be recovered. In this solution, pixel distribution of the image sensor is adjusted by controlling deformation of a controllably-deformable material part, which is simple and easily implemented. The controllably-deformable material part is made from at least one or more of the following controllably-deformable materials: a piezoelectric material, an electro-active polymer, a photo-deformable material, and a magnetostrictive material.

Figure 1B:
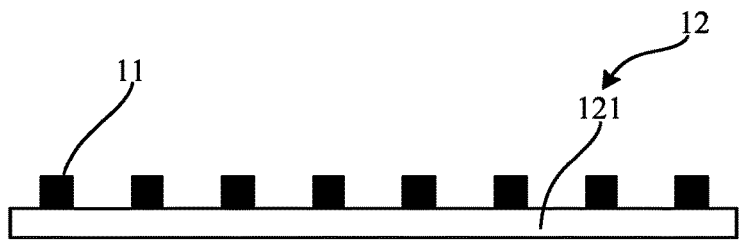
FIG. 1b is a schematic structural diagram of a first image sensor with an adjustable pixel density, according to an embodiment of the present application.

FIG. 1b is a schematic structural diagram of a first image sensor with an adjustable pixel density according to an embodiment of the present application. As shown in FIG. 1b, the image sensor with an adjustable pixel density provided by this embodiment of the present application comprises: a plurality of image sensor pixels 11 and a controllably-deformable material part 12, wherein the image sensor performs image capture by using the image sensor pixels 11; the plurality of image sensor pixels 11 are distributed in an array form; the controllably-deformable material part 12 is connected to the plurality of image sensor pixels 11 separately; and the controllably-deformable material part 12 may deform under the effect of an external field, so as to accordingly adjust distribution of the plurality of image sensor pixels 11.

In the technical solution provided by this embodiment of the present application, for the controllably-deformable material part, when an external field influencing factor acting thereon is changed, the controllably-deformable material part can be caused to deform; and when the external field influencing factor is removed or changed, the deformation of the controllably-deformable material part can be recovered. The external field may be selected from a corresponding external control filed acting thereon according to deformation characteristics of the controllably-deformable material part. For example, the external field comprises but is not limited to an external electric field, a magnetic field, a light field, and the like. The image sensor pixel may comprise but is not limited to at least one photoelectric conversion unit. Each image sensor pixel and a controllably-deformable material part may be closely connected by using (but not limited to) an adhesion manner, so that when the controllably-deformable material part deforms, an interval between the image sensor pixels is accordingly adjusted, so as to change pixel distribution of the image sensor, and achieve an effect of differentiated pixel density distribution in different regions of the image sensor according to actual demands.

In practical application, an unevenly distributed external field may be applied on different regions of the controllably-deformable material part, to cause the different regions of the controllably-deformable material part to undergo different degrees of deformation, thereby adjusting integral distribution of image sensor pixels. Optionally, the external field may be applied on a region where the controllably-deformable material part and the plurality of image sensor pixels are not overlapped, to cause an overlap region of the controllably-deformable material part and the plurality of image sensor pixels not to deform. Instead, distribution of image sensor pixels is changed through deformation of another part of the controllably-deformable material part. This solution is favorable to preventing damage to the image sensor pixels caused by deformation of the controllably-deformable material part.

In practical application, the controllably-deformable material part may be made by selecting at least one suitable controllably-deformable material as demanded, to cause the controllably-deformable material part to have a feature of deformability and deformation recoverability. Optionally, the controllably-deformable material part is made from at least one or more of the following controllably-deformable materials: a piezoelectric material, an electroactive polymer, a photo-deformable material, and a magnetostrictive material.

The piezoelectric material may undergo mechanical deformation under an effect of an electric field. A controllably-deformable material part made by using the piezoelectric material is referred to as a piezoelectric material part below. With this physical property of the piezoelectric material, in this embodiment of the present application, electric field control information required for causing the piezoelectric material part to undergo corresponding mechanical deformation is determined according to (but not limited to) a target sub-pixel offset distance, and an electric field acting on the piezoelectric material part is controlled according to the electric field control information, to cause the piezoelectric material part to undergo corresponding mechanical deformation, so as to accordingly adjust pixel distribution of an image sensor, thereby achieving a purpose of adjusting pixel density distributions of the image sensor according to the target sub-pixel offset distance. The piezoelectric material may comprise but is not limited to at least one of the following: a piezoelectric ceramic, and a piezoelectric crystal. This solution can fully utilize a physical property of a piezoelectric material to adjust pixel distribution of an image sensor.

The electroactive polymers (EAP for short) are a type of polymer materials that may be changed in shape or size under the effect of an electric field. A controllably-deformable material part made by using the electroactive polymer is referred to as an electroactive polymer part below. With this physical property of the electroactive polymers, in this embodiment of the present application, electric field control information required for causing the electroactive polymer part to undergo corresponding deformation is determined according to (but not limited to) the target sub-pixel offset distance, and an electric field acting on the electroactive polymer layer is controlled according to the electric field control information, to cause the electroactive polymer layer to undergo corresponding deformation, so as to accordingly adjust pixel distribution of an image sensor, thereby achieving a purpose of adjusting pixel distribution of the image sensor according to the target sub-pixel offset distance. The electroactive polymer may comprise but is not limited to at least one of the following: an electronic electroactive polymer, and an ionic electroactive polymer, wherein the electronic electroactive polymer comprises at least one of the following: a ferroelectric polymer (such as polyvinylidene fluoride), an electrostrictive graft polymer, and a liquid crystalline elastomer; and the ionic electroactive polymer comprises at least one of the following: an electrorheological fluid, and an ionic polymer-metal composite. This solution can fully utilize a physical property of an electroactive polymer to adjust pixel distribution of an image sensor.

The photo-deformable material is a type of macromolecule material that may exhibit a change in shape or size under an effect of a light field. A controllably-deformable material part made by using the photo-deformable material is referred to as a photo-deformable material part below. With this physical property of the photo-deformable material, in this embodiment of the present application, light field control information required for causing a photo-deformable material part to undergo corresponding deformation is determined according to (but not limited to) the target sub-pixel offset distance, and a light field acting on the photo-deformable material part is controlled according to the light field control information, to cause the photo-deformable material part to undergo corresponding deformation. Pixel distribution of an image sensor is accordingly adjusted through deformation of the photo-deformable material part, thereby achieving a purpose of adjusting pixel distribution of the image sensor according to the target sub-pixel offset distance. The photo-deformable material may comprise but is not limited to at least one of the following: a photostrictive ferroelectric ceramic and a photo-deformable polymer, wherein the photostrictive ferroelectric ceramic comprises but is not limited to a lead lanthanum zirconate titanate (PLZT) ceramic, and the photo-deformable polymer comprises but is not limited to a photo-deformable liquid crystalline elastomer. This solution can fully utilize a physical property of a photo-deformable material to adjust pixel distribution of an image sensor.

The magnetostrictive material is a type of magnetic material that may exhibit a change in magnetic state under an effect of a magnetic field, and then exhibit a change in size thereof. A controllably-deformable material part made by using the magnetostrictive material is referred to as a magnetostrictive material part below. With this physical property of the magnetostrictive material, in this embodiment of the present application, magnetic field control information required for causing a magnetostrictive material part to undergo corresponding deformation is determined according to (but not limited to) the target sub-pixel offset distance, and a magnetic field acting on the magnetostrictive material part is controlled according to the magnetic field control information, to cause the magnetostrictive material part to undergo corresponding deformation. Pixel distribution of an image sensor is accordingly adjusted through deformation of the magnetostrictive material part, thereby achieving a purpose of adjusting pixel distribution of the image sensor according to the target sub-pixel offset distance. The magnetostrictive material may comprise but is not limited to a rare-earth iron giant magnetostrictive material, such as an alloy material $Tbo_{0.3}Dy_{0.7}Fe_{1.95}$ with a compound $(Tb, Dy)Fe_2$ as a substrate. This solution can fully utilize a physical property of a magnetostrictive material to adjust pixel distribution of an image sensor.

In the technical solution provided by this embodiment of the present application, specific structures and connection manners of image sensor pixels and the controllably-deformable material part may be determined according to actual demands, and practical manners are very flexible.

In an alternative implementation manner, as shown in FIG. 1b, the controllably-deformable material part 12 comprises a controllably-deformable material layer 121, wherein the plurality of image sensor pixels 11 is distributed in an array form and connected to a surface of the controllably-deformable material layer 121. Optionally, depending on actual technological conditions, the plurality of image sensor pixels are directly formed on the controllably-deformable material layer 12, or the plurality of image sensor pixels and the controllably-deformable material layer 12 are separately made and closely connected by using (but not limited to) an adhesion manner. This solution features a simple structure and is easily implemented.

Figure 1C:
FIG. 1c is a schematic structural diagram of a second image sensor with an adjustable pixel density, according to an embodiment of the present application.

In another alternative implementation manner, as shown in FIG. 1c, the controllably-deformable material part 12 comprises a plurality of controllably-deformable material connection sub-parts 122, wherein the plurality of controllably-deformable material connection sub-parts 122 is distributed in an array form, and correspondingly connected to the plurality of image sensor pixels 11 distributed in an array form, that is, the plurality of image sensor pixels distributed in an array form is connected as a whole through the plurality of controllably-deformable material connection sub-parts that is distributed in an array form. Optionally, the plurality of controllably-deformable material connection sub-parts may be formed in an interval between pixels of an image sensor pixels array according to actual technology, and the plurality of controllably-deformable material connection sub-parts may be connected to corresponding image sensor pixels by using (but not limited to) an abutting or adhesion manner. Distribution of image sensor pixels may be adjusted by controlling deformation of the plurality of controllably-deformable material connection sub-parts, which features a simple structure and is easily implemented.

Figure 1D:
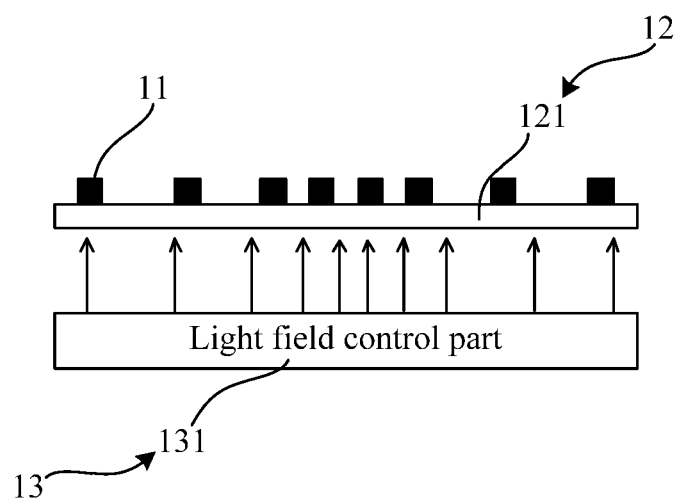
FIG. 1d is a schematic structural diagram of a third image sensor with an adjustable pixel density, according to an embodiment of the present application.
Figure 1E:
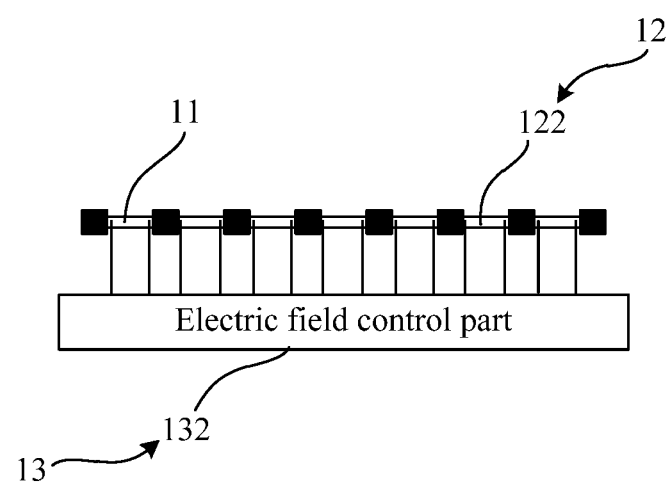
FIG. 1e is a schematic structural diagram of a fourth image sensor with an adjustable pixel density, according to an embodiment of the present application.

Further, as shown in FIG. 1d and FIG. 1e, the image sensor may further comprise a deformation control part 13, wherein the deformation control part 13 is configured to adjust distribution of the external field acting on the controllably-deformable material part 12, so as to control the controllably-deformable material part 12 to undergo corresponding deformation. In this way, when the controllably-deformable material part 12 deforms, an interval between the image sensor pixels 11 may be accordingly adjusted, so as to change distribution of the image sensor pixels 11, thereby achieving an effect of differentiated pixel distribution in different regions of the image sensor according to actual demands.

Optionally, as shown in FIG. 1d, the deformation control part may comprise a light field control part 131, wherein the light field control part 131 is configured to adjust distribution of an external light field acting on the controllably-deformable material part 12, so as to control the controllably—deformable material part 12 to undergo corresponding deformation. Under this circumstance, the controllably-deformable material part 12 may comprise a photo-deformable material part that is at least made from a photo-deformable material. For example, the photo-deformable material part may comprise a photodeformable material layer that is at least made from the photo-deformable material; or the photo-deformable material part may comprise a plurality of photo-deformable material connection sub-parts that is at least made from the photo-deformable material. Different regions of the controllably-deformable material part 12 are excited to undergo different degrees of deformation by means of changing, by the light field control part 131, distribution of a light field acting on the photo-deformable material part (in FIG. 1d, different arrow densities are used for representing different intensity distribution of a light field acting on the controllably-deformable material part 12), and an interval between the image sensor pixels 11 is accordingly adjusted through deformation of the controllably-deformable material part 12, so as to change distribution of the image sensor pixels 11, thereby achieving an effect of differentiated pixel distribution in different regions of the image sensor according to actual demands.

Figure 1F:
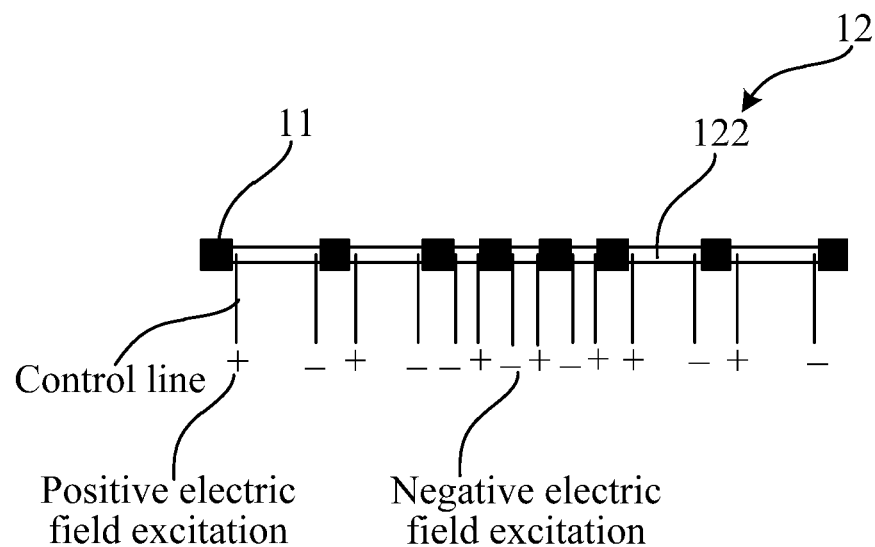
FIG. 1f is a scenario example of pixel density adjustment performed on an image sensor under a circumstance of uneven light field excitation, according to an embodiment of the present application.

Optionally, as shown in FIG. 1e, the deformation control part may comprise an electric field control part 132, wherein the electric field control part 132 is configured to adjust distribution of an external electric field acting on the controllably-deformable material part, so as to control the controllably-deformable material part to undergo corresponding deformation. Under this circumstance, the controllably-deformable material part 12 may comprise a piezoelectric material part (such as a piezoelectric material layer or a piezoelectric material connection sub-part) at least made from a piezoelectric material, or the controllably-deformable material part 12 may comprise an electroactive polymer part (such as an electroactive polymer layer or an electroactive polymer connection sub-part) at least made from an electroactive polymer. As shown in FIG. 1e, an electric field control part and a controllably-deformable material may be connected by using a control line. Different regions of the controllably-deformable material part 12 are excited to undergo different degrees of deformation by means of changing by the electric field control part 132 distribution of an electric field acting on the controllably-deformable material part 12. If the electric field acting on the controllably-deformable material part 12 is a zero electric field, the controllably-deformable material part will not deform (or called zero electric field excitation); if intensity distribution of the electric field acting on the controllably-deformable material part 12 is changed (positive electric field excitation "+" and negative electric field excitation "−" as shown in the figure), the intensity of the electric field acting on different regions of the controllably-deformable material part 12 is caused to vary, as shown in FIG. 1f. In this way, different regions of the controllably-deformable material part may undergo different degrees of deformation, and an interval between the image sensor pixels 11 is accordingly adjusted through deformation of the controllably-deformable material part 12, so as to change integral pixel distribution of an image sensor, thereby achieving an effect of differentiated pixel distribution in different regions of the image sensor according to actual demands.

In this embodiment of the present application, the controllably-deformable material part may be directly or indirectly connected to the deformation control part. The deformation control part may act as a part of the image sensor or not. The image sensor may be connected to the deformation control part in a manner such as reserving a pin or an interface. The external field acting on the controllably-deformable material part may comprise but is not limited to an electric field, a magnetic field, a light field, or the like. A hardware and software structure used for generating an electric field, a hardware and software structure used for generating a magnetic field, and a hardware and software structure used for generating a light field, may be implemented by using corresponding existing technologies according to actual demands. The details are not described again in this embodiment of the present application.

Figure 1G:
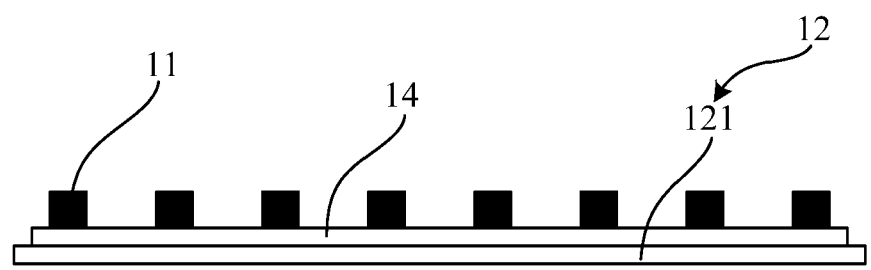
FIG. 1g is a schematic structural diagram of a fifth image sensor with an adjustable pixel density, according to an embodiment of the present application.
Figure 1H:
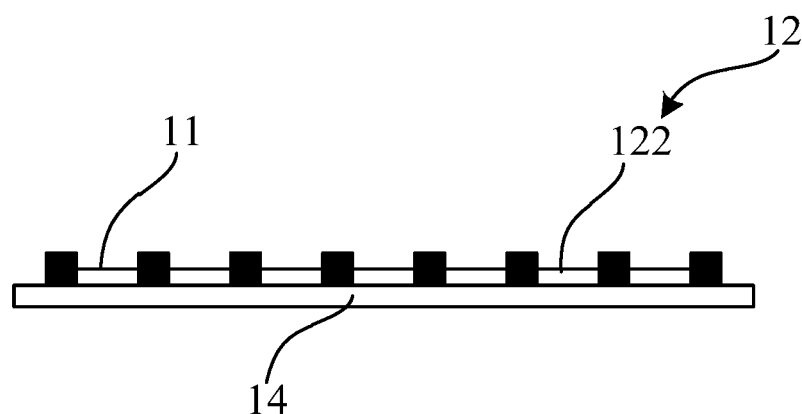
FIG. 1h is a schematic structural diagram of a sixth image sensor with an adjustable pixel density, according to an embodiment of the present application.

Optionally, the image sensor may further comprise a flexible lining, wherein the flexible lining may comprise but is not limited to a flexible plastic lining with certain flexibility. The shape of the flexible lining may be changed as demanded. Image sensor pixels and a controllably-deformable material part may be disposed on a same side or different sides of the flexible lining. For example, as shown in FIG. 1g, the plurality of image sensor pixels 11 is connected to a surface of a flexible lining 14, and a controllably-deformable material part (such as a controllably-deformable material layer 121) is connected to another surface of the flexible lining 14. For another example, as shown in FIG. 1h, the plurality of image sensor pixels 11 is connected to a surface of a flexible lining 14, and a controllably-deformable material part (such as a controllably-deformable material connection sub-part 122) is connected to a corresponding image sensor pixel and located with the image sensor pixel 11 on the same surface of the flexible lining 14. In this solution, integral pixel distribution of an image sensor is indirectly adjusted through deformation of a controllably-deformable material part under control of an external field acting thereon, thereby achieving an adjustable pixel density of the image sensor. In addition, the shape of the image sensor may be flexibly changed by using a flexible lining, for example, a planar image sensor is bent to a certain angular degree, so as to obtain a curved image sensor, thereby satisfying diversified application demands of image capture, decoration and the like.

Figure 1I:
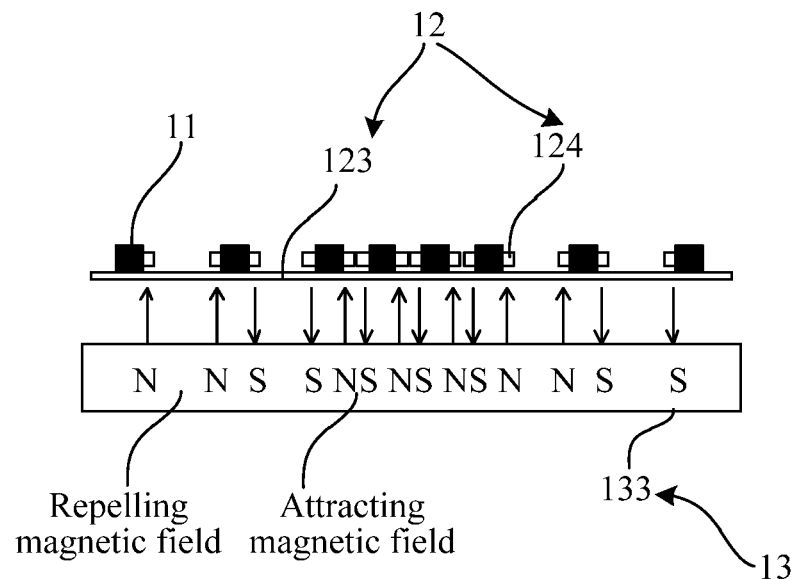
FIG. 1i is a schematic structural diagram of a seventh image sensor with an adjustable pixel density, according to an embodiment of the present application.

FIG. 1i is a schematic structural diagram of a seventh image sensor with an adjustable pixel density according to an embodiment of the present application. In an image sensor as shown in FIG. 1i, the controllably-deformable material part 12 comprises a flexible lining 123 and a plurality of magnetic conductive material parts 124, wherein a plurality of image sensor pixels 11 is separately connected to the flexible lining 123, and at least some of the image sensor pixels 11 are connected to the plurality of magnetic conductive material parts 124. The flexible lining 123 is caused to undergo corresponding deformation by change of a magnetic field acting on the magnetic conductive material part 124, so as to accordingly adjust density distribution of the plurality of image sensor pixels 11. For example, a magnetic conductive material part 124 may be disposed on a side surface of each image sensor pixel. Optionally, the image sensor pixel 11 is separately adhered to the flexible lining 123 and the magnetic conductive material part 124. The magnetic conductive material part may comprise a magnetic pole made from a magnetic conductive material, wherein the magnetic conductive material may comprise but is not limited to one or more of a soft magnetic material, a silicon steel sheet, a permalloy, a ferrite, an amorphous soft magnetic alloy, a super-microcrystalline soft magnetic alloy, and the like. The magnetic conductive material part made from a soft magnetic material has a good magnetic conductivity, and after removal of a magnetic field, residual magnetism is very small, which facilitates adjustment next time.

Further, optionally, the deformation control part 13 in this embodiment of the present application may further comprise a magnetic field control part 133, wherein the magnetic field control part 133 is configured to adjust distribution of an external magnetic field acting on the controllably-deformable material part, so as to control the controllably-deformable material part to undergo corresponding deformation. For example, when the magnetic control part 133 controls a magnetic field (namely, an exciting magnetic field) that acts on the magnetic conductive material part 124 to change, as shown in FIG. 1i, a repelling magnetic field induced by same magnetic poles (NN or SS) or an attracting magnetic field induced by different magnetic poles (NS or SN) with a certain distribution intensity is imposed on adjacent image sensor pixels, a force of magnetic repulsion or attraction between magnetic poles will be induced accordingly. The magnetic force is transmitted to the flexible lining 123, to cause the flexible lining 123 to undergo deformation such as expansion and shrinkage, thereby changing an interval between corresponding image sensor pixels, and achieving a purpose of adjusting pixel distribution of an image sensor. In combination with deformability (such as expandability and shrinkage) characteristics of a flexible lining and the principle of magnetic field control, this solution can achieve adjustable pixel distribution of an image sensor.

Figure 1J:
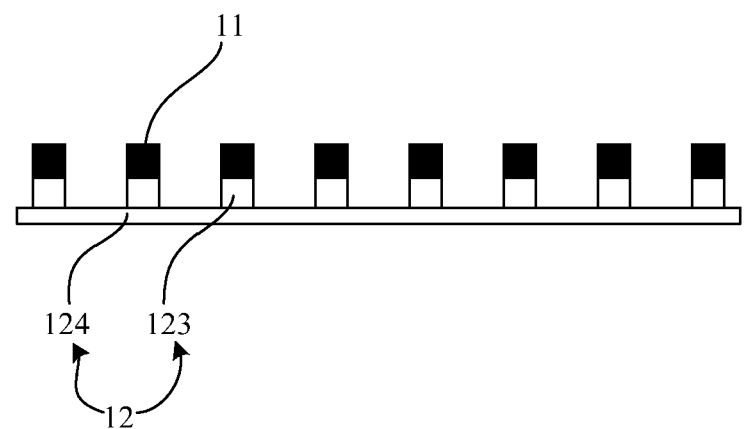
FIG. 1j is a schematic structural diagram of an eighth image sensor with an adjustable pixel density, according to an embodiment of the present application.

FIG. 1j is a schematic structural diagram of an eighth image sensor with an adjustable pixel density according to an embodiment of the present application. In an image sensor as shown in FIG. 1j, the controllably-deformable material part 12 comprises: a flexible lining 123 and a plurality of magnetic conductive material parts 124, wherein a surface of the plurality of magnetic conductive material parts 124 is separately connected to the flexible lining 123, and an opposite surface of the plurality of magnetic conductive material parts 124 is separately connected to the plurality of image sensor pixels 11 correspondingly. The flexible lining 123 is caused to undergo corresponding deformation by change of a magnetic field acting on the magnetic conductive material part 124, so as to accordingly adjust density distribution of the plurality of image sensor pixels 11. Optionally, the magnetic conductive material part 124 is adhered to the flexible lining 123, and the image sensor pixels 11 are adhered to the magnetic conductive material part 124. When a magnetic field acting on the magnetic conductive material part 124 changes, a magnetic force is transmitted to the flexible lining 123, and causes the flexible lining 123 to deform such as expand or shrink, thereby achieving a purpose of adjusting distribution of image sensor pixels. In combination with deformability (such as expandability and shrinkage) characteristics of a flexible lining and the principle of magnetic field control, this solution can achieve adjustable pixel distribution of an image sensor.

It may be understood by a person skilled in the art that, in any one of the foregoing methods of specific implementation manners of the present application, the value of the serial number of each step described above does not mean an execution sequence, and the execution sequence of the steps should be determined according to the function and internal logic thereof, and should not constitute any limitation to the implementation procedure of the specific implementation manners of the present application.

Figure 2:
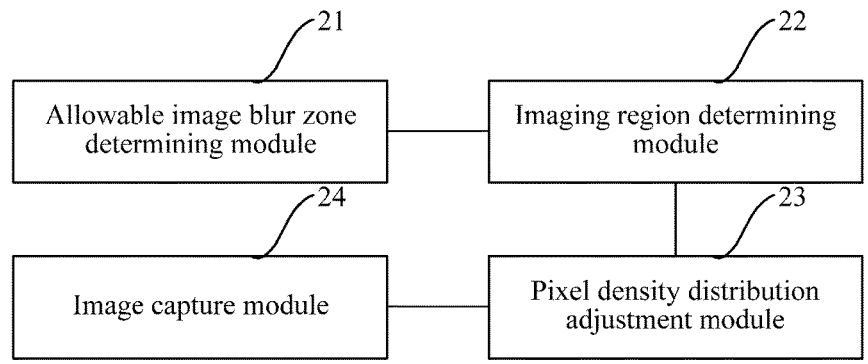
FIG. 2 is a logic block diagram of a first image capture control apparatus, according to an embodiment of the present application.

FIG. 2 is a structural block diagram of an image capture control apparatus according to an embodiment of the present application. As shown in FIG. 2, the image capture control apparatus provided by this embodiment of the present application comprises: an allowable image blur zone determining module 21, an imaging region determining module 22, a pixel density distribution adjustment module 23 and an image capture module 24.

The allowable image blur zone determining module 21 is configured to determine a first zone as an allowable image blur zone, the first zone being a part of a shooting scene.

The imaging region determining module 22 is configured to determine an imaging region that corresponds to the allowable image blur zone in an image sensor.

The pixel density distribution adjustment module 23 is configured to adjust pixel density distributions of the image sensor, so as to cause a pixel density of the imaging region to be lower than that of another imaging region in the image sensor after being adjusted.

The image capture module 24 is configured to perform, by using the image sensor after being adjusted, image capture on the shooting scene.

According to the technical solution provided by this embodiment of the present application, a part of a shooting scene is determined as an allowable image blur zone, based on which pixel density distribution of an image sensor is adjusted. A pixel density of an imaging region that corresponds to the allowable image blur zone is lower than that of another region in the image sensor after being adjusted. In this way, a part of pixels of the image sensor that are used for capturing an allowable image blur zone of a shooting scene may be adjusted to capture an image of another zone of the shooting scene, to cause the image sensor after being adjusted to have more pixels used for capturing an image of another zone of the shooting scene, so as to reduce pixel waste possibly caused by image capture of the allowable image blur zone of the shooting scene under a condition of meeting an imaging requirement for the allowable image blur zone, thereby fully utilizing pixel resources of the image sensor to improve imaging quality of another zone in the shooting scene, improving pixel utilization of the image sensor, and better satisfying a user's diversified actual application demands.

The image capture control apparatus may perform capture control on a static or dynamic image by using the image capture control method during an application procedure comprising but not limited to photo taking, camera shooting, photographing, and video monitoring. There is no limit to the manners in which the image capture control apparatus is embodied. For example, the image capture control apparatus may be an independent part, the part cooperating with an image capture device comprising an image sensor in communication; or the image capture control apparatus may be a functional module integrated in an image capture device comprising an image sensor. The image capture device may comprise but is not limited to an intelligent terminal such as a mobile phone, a camera, a video camera, and another type of image capture device having a camera shooting or photographing function, which is not limited in the embodiments of the present application.

Figure 3:
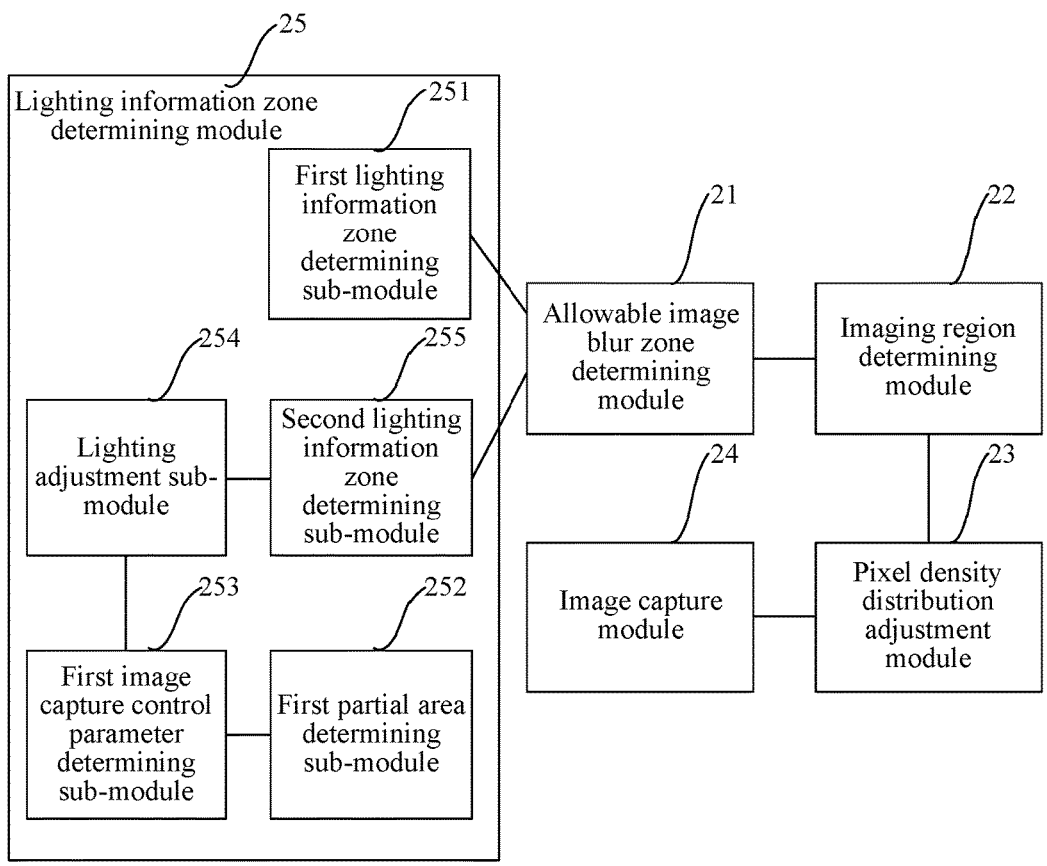
FIG. 3 is a logic block diagram of a second image capture control apparatus according to an embodiment of the present application.

Optionally, as shown in FIG. 3, the image capture control apparatus further comprises a lighting information zone determining module 25. The lighting information zone determining module 25 is configured to determine, according to at least lighting information of the shooting scene, the first zone. In this solution, a part of a shooting scene may be determined, according to lighting information of the shooting scene, as the first zone. From the view of imaging quality, image blur is allowed for the first zone when compared with another zone of the shooting scene. Therefore, a part of original pixel points of the image sensor that correspondingly capture the first zone may be used for capturing an image of another zone of the shooting scene.

Optionally, the lighting information zone determining module 25 comprises a first lighting information zone determining sub-module 251. The first lighting information zone determining sub-module 251 is configured to determine a partial area of the shooting scene, for which lighting information comprised in a current image capture control parameter fails to meet a pre-determined lighting requirement, as the first zone. The lighting requirement may be determined according to actual demands. This solution is implemented in a simple manner.

Optionally, the lighting information zone determining module 25 comprises a first partial area determining sub-module 252, a first image capture control parameter determining sub-module 253, a lighting adjustment sub-module 254 and a second lighting information zone determining sub-module 255. The first partial area determining sub-module 252 is configured to determine a partial area of the shooting scene for which lighting information comprised in a current image capture control parameter fails to meet a pre-determined lighting requirement; the first image capture control parameter determining sub-module 253 is configured to adjust at least one image capture control parameter of the shooting scene; the lighting adjustment sub-module 254 is configured to re-determine, based on an image capture control parameter after being adjusted, lighting information of the partial area; and the second lighting information zone determining sub-module 255 is configured to determine, in response to a case if the re-determined lighting information still fails to meet the pre-determined lighting requirement, the determined partial area as the first zone. This solution improves accuracy of determining an allowable image blur zone of the shooting scene.

Figure 4:
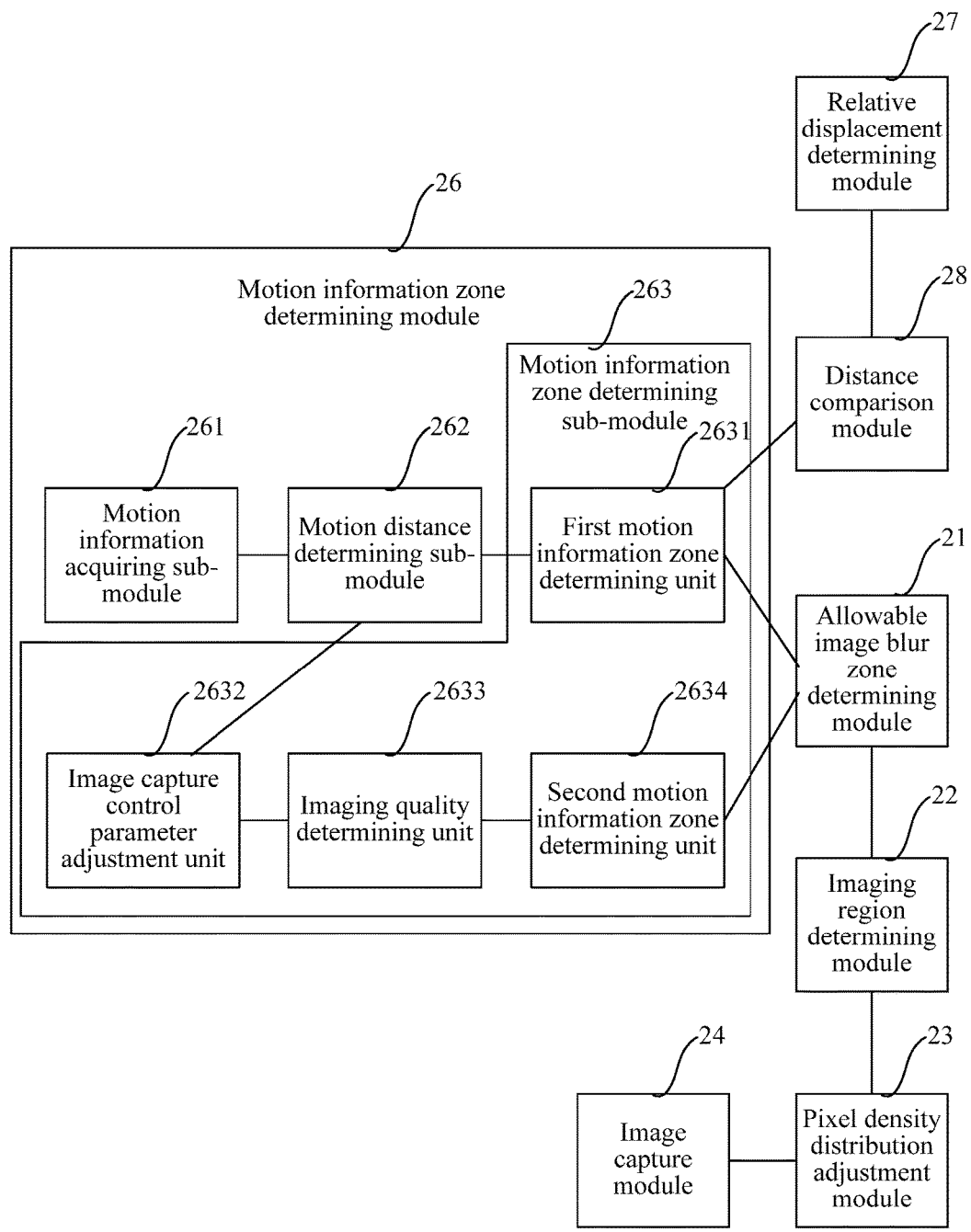
FIG. 4 is a logic block diagram of a third image capture control apparatus, according to an embodiment of the present application.

Optionally, as shown in FIG. 4, the image capture control apparatus further comprises a motion information zone determining module 26. The motion information zone determining module 26 is configured to determine, according to at least motion information of a shot object in the shooting scene, the first zone. In this solution, a part of a shooting scene may be determined, according to motion information of a shot object in the shooting scene, as the first zone. From the view of imaging quality, image blur is allowed for the first zone when compared with another zone of the shooting scene. Therefore, a part of original pixel points of the image sensor that correspondingly capture the first zone may be used for capturing an image of another zone of the shooting scene.

Optionally, the motion information zone determining module 26 comprises: a motion information acquiring sub-module 261, a motion distance determining sub-module 262 and a motion information zone determining sub-module 263. The motion information acquiring sub-module 261 is configured to acquire motion information of a shot object in the shooting scene; the motion distance determining sub-module 262 is configured to determine, according to the motion information, a motion distance of the shot object within a pre-determining image capture duration; and the motion information zone determining sub-module 263 is configured to determine a zone that corresponds to the motion distance in the shooting scene as the first zone. In this solution, a partial area of a shot object that corresponds to a possible motion distance of the shot object within a pre-determined image capture duration may be determined as the first zone, which is simple and easily implemented.

Optionally, the image capture control apparatus further comprises a relative displacement determining module 27 and a distance comparison module 28. The relative displacement determining module 27 is configured to determine a relative displacement of a motion distance relative to the image sensor; and the distance comparison module 28 is configured to compare the relative displacement with an allowable displacement. Accordingly, the motion information zone determining sub-module 263 comprises a first motion information zone determining unit 2631. The first motion information zone determining unit 2631 is configured to determine, in response to a case if a comparison result from the distance comparison module shows that the relative displacement exceeds the allowable displacement, a zone that corresponds to the motion distance as the first zone. This solution is favorable to improving accuracy of determining the first zone.

Optionally, the motion information zone determining sub-module 263 comprises an image capture control parameter adjustment unit 2632, an imaging quality determining unit 2633 and a second motion information zone determining unit 2634. The image capture control parameter adjustment unit 2632 is configured to adjust, in response to a case if imaging quality of a zone that corresponds to the motion distance fails to meet a pre-determined imaging quality requirement, at least one image capture control parameter of the shooting scene; the imaging quality determining unit 2633 is configured to re-determine, based on an image capture control parameter after being adjusted, imaging quality of a zone that corresponds to the motion distance; and the second motion information zone determining unit 2634 is configured to determine, in response to a case if re-determined imaging quality still fails to meet the imaging quality requirement, the determined partial area as the first zone. This solution improves accuracy of determining an allowable image blur zone of the shooting scene.

Figure 5:
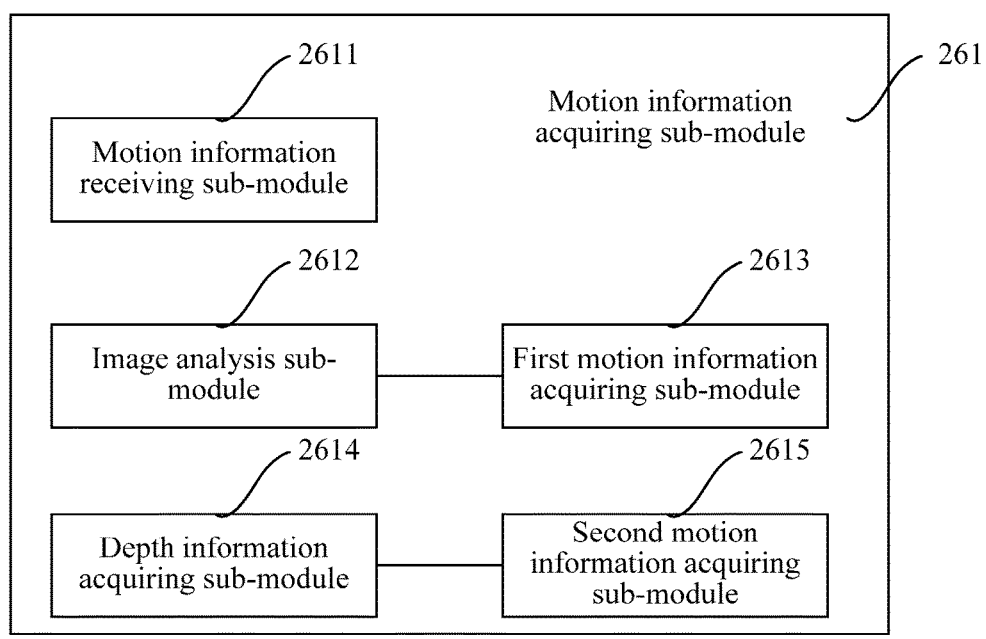
FIG. 5 is an optional logic block diagram of a motion information acquiring sub-module, according to an embodiment of the present application.

Optionally, as shown in FIG. 5, the motion information acquiring sub-module 261 comprises a motion information receiving sub-module 2611. The motion information receiving sub-module 2611 is configured to receive motion information of the shot object. In this solution, image capture control may be implemented by fully utilizing interaction of intelligent devices or in a manner such as sharing of motion information of a shot object, so as to improve flexibility of motion information acquiring.

Optionally, the motion information acquiring sub-module 261 comprises: an image analysis sub-module 2612 and a first motion information acquiring sub-module 2613. The image analysis sub-module 2612 is configured to analyze a preview image of the shooting scene; and the first motion information acquiring sub-module 2613 is configured to acquire, according to an analysis result, motion information of the shot object. In this solution, motion information of a shot object is acquired by means of analyzing a preview image of the shot object before formal shooting and estimating a rough motion trend of the shot object, which is simple and easily implemented.

Optionally, the motion information acquiring sub-module 261 comprises a depth information acquiring sub-module 2614 and a second motion information acquiring sub-module 2615. The depth information acquiring sub-module 2614 is configured to acquire real-time depth information of the shooting scene; and the second motion information acquiring sub-module 2615 is configured to acquire, according to the real-time depth information, motion information of the shot object. In this solution, acquired motion information of a shot object is relatively accurate.

Figure 6:
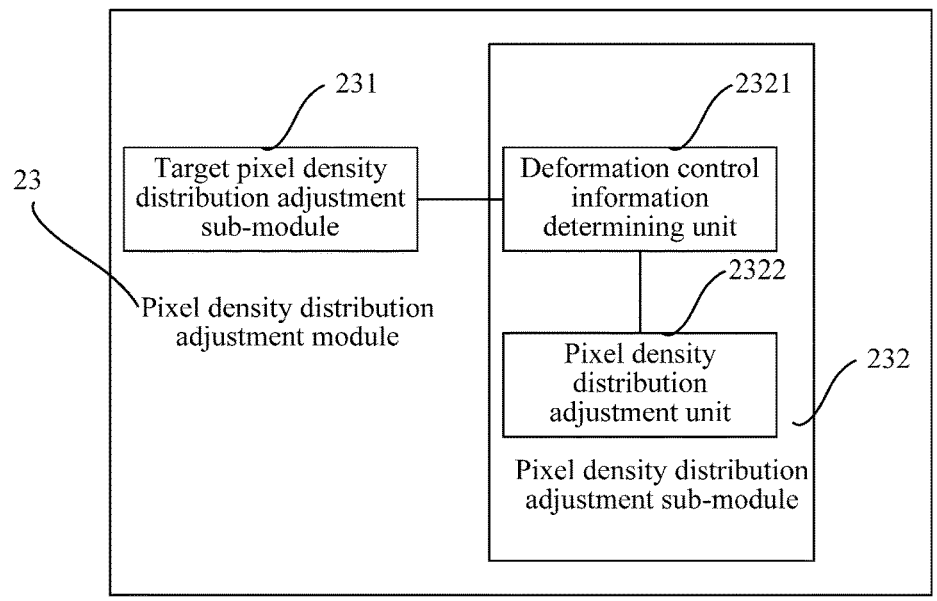
FIG. 6 is an optional logic block diagram of a pixel density distribution adjustment module, according to an embodiment of the present application.

Optionally, as shown in FIG. 6, the pixel density distribution adjustment module 23 comprises: a target pixel density distribution adjustment sub-module 231 and a pixel density distribution adjustment sub-module 232. The target pixel density distribution adjustment sub-module 231 is configured to determine target pixel density distribution information of the image sensor, wherein a target pixel density that corresponds to the imaging region is lower than that of another imaging region in the target pixel density distribution information. The pixel density distribution adjustment sub-module 232 is configured to adjust, according to the target pixel density distribution information, pixel density distribution of the image sensor. This solution can reduce pixel waste possibly caused by image capture of the allowable image blur zone, so as to fully utilize pixel resources of an image sensor and improve imaging quality of another zone of a shooting scene.

Optionally, the pixel density distribution adjustment sub-module 232 comprises: a deformation control information determining unit 2321 and a pixel density distribution adjustment unit 2322. The deformation control information determining unit 2321 is configured to determine, according to the target pixel density distribution information, deformation control information of a controllably-deformable material part of the image sensor; and the pixel density distribution adjustment unit 2322 is configured to control, according to the deformation control information, the controllably-deformable material part to deform, so as to accordingly adjust pixel density distributions of the image sensor. Pixel waste possibly caused by image capture of the allowable image blur zone is reduced, so as to fully utilize pixel resources of an image sensor and improve imaging quality of another zone of a shooting scene.

Figure 7:
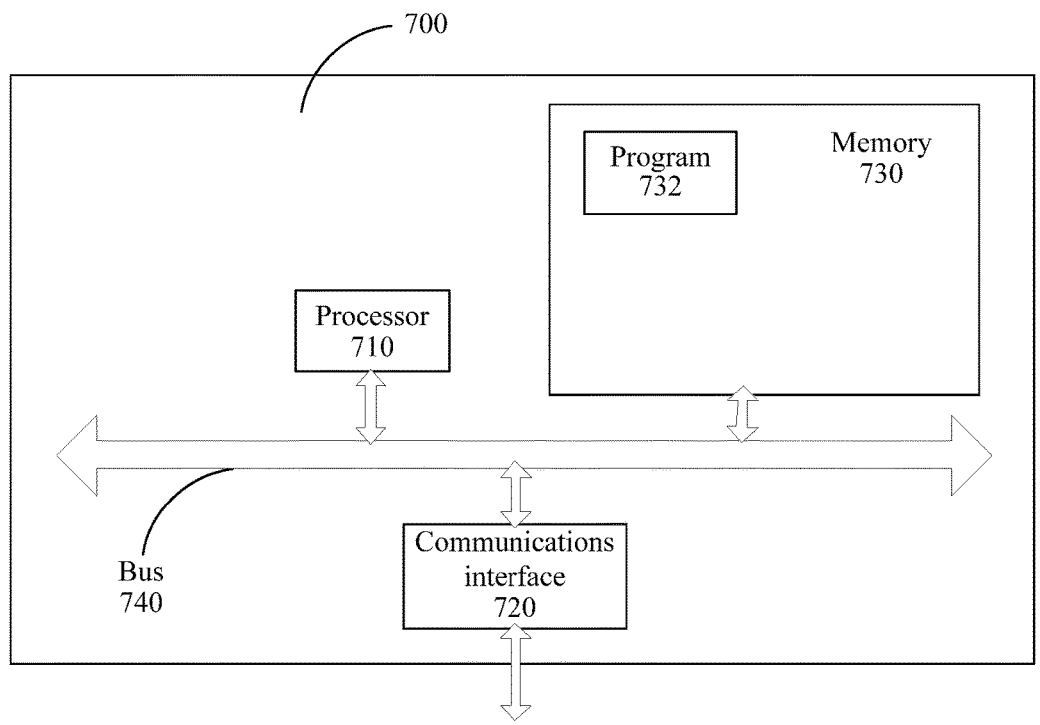
FIG. 7 is a logic block diagram of a third image capture control apparatus, according to an embodiment of the present application.

FIG. 7 is a structural block diagram of still another image capture control apparatus according to an embodiment of the present application. The specific implementation manner of the image capture control apparatus 700 is not limited in specific embodiments of the present application. As shown in FIG. 7, the image capture control apparatus 700 may comprise:

a processor 710, a communications interface 720, a memory 730, and a communications bus 740, wherein:

the processor 710, the communications interface 720, and the memory 730 communicate with each other by using the communications bus 740;

the communications interface 720 is configured to communication with, for example, a device having a function of communications, and an external optical source; and the processor 710 is configured to execute a program 732, and specifically, can perform relevant steps in any one of the foregoing embodiments of an image capture control method.

For example, the program 732 may comprise program code, wherein the program code comprises a computer operation instruction.

The processor 710 may be a central processing unit (CPU for short), an application specific integrated circuit (ASIC for short), or one or more integrated circuits configured to implement the embodiments of the present application.

The memory 730 is configured to store the program 732. The memory 730 may comprise a random access memory (RAM for short), and may also comprise a non-volatile memory, for example, at least one magnetic disk memory.

For example, in an alternative implementation manner, the processor 710 may perform, by executing the program 732, the following steps: determining a first zone as an allowable image blur zone, the first zone being a part of a shooting scene; determining an imaging region that corresponds to the allowable image blur zone in an image sensor; adjusting pixel density distributions of the image sensor, to cause a pixel density of the imaging region to be lower than that of another imaging region in the image sensor after being adjusted; and performing, by using the image sensor after being adjusted, image capture on the shooting scene.

In another alternative implementation manner, the processor 710 can also perform, by executing the program 732, steps mentioned in any other one of the foregoing embodiments, and the details are not described herein again.

For specific implementation of steps of the program 732, refer to the description of corresponding steps, modules, sub-modules and units in the foregoing embodiments. The details are not described herein again. A person skilled in the art may clearly understand that, for the specific operation procedure of the above devices and modules, the description of corresponding procedures in the foregoing method embodiments may be referred to for the purpose of convenient and brief description. The details are not described herein again.

In the foregoing embodiments of the present application, the serial number and/or sequence of the embodiments are only used for the convenience of description, and do not represent inferiority or superiority of the embodiments. The description of each embodiment has a different focus. For any part of an embodiment not described in details, refer to relevant description of another embodiment. For relevant description of the implementation principle or process of apparatus, device or system embodiments, refer to records of relevant method embodiments, and the details are not described herein again.

A person of ordinary skill in the art may recognize that, the units, methods and procedures of each example described with reference to the embodiments disclosed herein, can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

When the functions are implemented in a form of a software functional unit and sold or used as an independent product, the functions may be stored in a computer-readable storage medium. Based on such an understanding, the technical solutions of the present application essentially, or a part thereof contributing to the existing art, or a part of the technical solutions may be implemented in the form of a software product. The computer software product is stored in a storage medium and comprises several instructions for instructing a computer device (which may be a personal computer, a server, a network device, or the like) to perform all or some of the steps of the image capture control methods in the embodiments of the present application. The foregoing storage medium comprises: any medium that can store program code, such as a USB flash drive, a removable hard disk, a read-only memory (ROM for short), a random access memory (RAM for short), a magnetic disk, or an optical disc.

In the apparatus, method and system embodiments of the present application, apparently, each component (such as a system, a sub-system, a module, a sub-module, a unit, and a sub-unit) or each step may be decomposed, combined and/or recombined after decomposition. Such decomposition and/or recombination shall be considered as an equivalent solution of the present application. In addition, in the above description of specific embodiments of the present application, a feature described and/or shown in one implementation manner may be used in one or more other implementation manners by using a same or similar manner, combined with a feature of another implementation manner, or replace a feature of another implementation manner.

It should be emphasized that, the term "comprise" used herein refers to existence of a feature, an element, a step or a component, but does not exclude existence or addition of one or more other features, elements, steps or components.

Finally, it should be noted that, the above implementation manners are only used to describe the present application, rather than limit the present application. Various alterations and variants may also be made by a person of ordinary skill in the art without departing from the spirit and scope of the present application. Therefore, all equivalent technical solutions also belong to the scope of the present application, and the patent protection scope of the present application should be subject to the claims.

What is claimed is:

1. An image capture control method, comprising:
   determining a first zone as an allowable image blur zone, the first zone being a part of a shooting scene;
   determining a first imaging region that corresponds to the allowable image blur zone in an image sensor;
   adjusting pixel density distributions of the image sensor, to cause a first pixel density of the first imaging region to be lower than a second pixel density of a second imaging region in the image sensor after being adjusted; and
   performing, by using the image sensor after being adjusted, image capture on the shooting scene.

2. The image capture control method of claim 1, further comprising:
   determining, according to at least lighting information of the shooting scene, the first zone.

3. The image capture control method of claim 2, wherein the determining, according to at least lighting information of the shooting scene, the first zone comprises:
   determining a partial area of the shooting scene, for which lighting information comprised in a current image capture control parameter fails to meet a pre-determined lighting requirement, as the first zone.

4. The image capture control method of claim 2, wherein the determining, according to at least lighting information of the shooting scene, the first zone comprises:
   determining a partial area of the shooting scene, for which lighting information comprised in a current image capture control parameter fails to meet a pre-determined lighting requirement;
   adjusting at least one image capture control parameter of the shooting scene;
   re-determining, based on an image capture control parameter after being adjusted, lighting information of the partial area; and determining, if re-determined lighting information still fails to meet the pre-determined lighting requirement, the determined partial area as the first zone.

5. The image capture control method of claim 1, further comprising:
    determining, according to at least motion information of a shot object in the shooting scene, the first zone.

6. The image capture control method of claim 5, wherein the determining, according to at least motion information of a shot object in the shooting scene, the first zone comprises:
    acquiring motion information of a shot object in the shooting scene;
    determining, according to the motion information, a motion distance of the shot object within a pre-determined image capture duration; and
    determining a zone that corresponds to the motion distance in the shooting scene as the first zone.

7. The image capture control method of claim 6, wherein:
    before the determining a zone that corresponds to the motion distance in the shooting scene as the first zone, the method further comprises: determining a relative displacement of the motion distance relative to the image sensor; and comparing the relative displacement with an allowable displacement; and
    the determining a zone that corresponds to the motion distance in the shooting scene as the first zone, comprises: determining, in response to a case if a comparison result shows that the relative displacement exceeds the allowable displacement, a zone that corresponds to the motion distance as the first zone.

8. The image capture control method of claim 6, wherein the determining a zone that corresponds to the motion distance in the shooting scene as the first zone, comprises:
    adjusting, if imaging quality of a zone that corresponds to the motion distance fails to meet a pre-determined imaging quality requirement under current image capture control, at least one image capture control parameter of the shooting scene;
    re-determining, based on an image capture control parameter after being adjusted, imaging quality of the zone that corresponds to the motion distance; and
    determining, in response to a case if re-determined imaging quality still fails to meet the pre-determined imaging quality requirement, the determined partial area as the first zone.

9. The image capture control method of claim 5, wherein the acquiring motion information of a shot object in the shooting scene comprises:
    receiving motion information of the shot object.

10. The image capture control method of claim 5, wherein the acquiring motion information of a shot object in the shooting scene comprises:
    analyzing a preview image of the shooting scene; and
    acquiring, according to an analysis result, motion information of the shot object.

11. The image capture control method of claim 5, wherein the acquiring motion information of a shot object in the shooting scene comprises:
    acquiring real-time depth information of the shooting scene; and
    acquiring, according to the real-time depth information, motion information of the shot object.

12. The image capture control method of claim 1, wherein the adjusting the pixel density distributions of the image sensor comprises:
    determining target pixel density distribution information of the image sensor, wherein a first target pixel density corresponding to the first imaging region is lower than a second target pixel density of the second imaging region in the target pixel density distribution information; and
    adjusting, according to the target pixel density distribution information, pixel density distributions of the image sensor.

13. The image capture control method of claim 12, wherein the adjusting, according to the target pixel density distribution information, pixel density distributions of the image sensor comprises:
    determining, according to the target pixel density distribution information, deformation control information of a controllably-deformable material part of the image sensor; and
    controlling, according to the deformation control information, the controllably-deformable material part to deform, so as to accordingly adjust pixel density distributions of the image sensor.

14. The image capture control method of claim 13, wherein the controllably-deformable material part is made from at least one or more of the following controllably-deformable materials: a piezoelectric material, an electro-active polymer, a photo-deformable material, and a magnetostrictive material.

15. A computer readable storage apparatus, comprising at least one executable instruction, which, in response to execution, causes an image capture control apparatus comprising a processor to perform operations, comprising:
    determining a first zone as an allowable image blur zone, the first zone being a part of a shooting scene;
    determining a first imaging region that corresponds to the allowable image blur zone in an image sensor;
    adjusting pixel density distributions of the image sensor, to cause a first pixel density of the first imaging region to be lower than a second pixel density of a second imaging region in the image sensor after being adjusted; and
    performing, by using the image sensor after being adjusted, image capture on the shooting scene.

16. The computer readable storage apparatus of claim 15, wherein the operations further comprise:
    determining, according to at least lighting information of the shooting scene, the first zone.

17. The computer readable storage apparatus of claim 16, wherein the operations further comprise:
    determining a partial area of the shooting scene, for which lighting information comprised in a current image capture control parameter fails to meet a pre-determined lighting requirement, as the first zone.

18. The computer readable storage apparatus of claim 16, wherein the operation further comprise:
    determining a partial area of the shooting scene, for which lighting information comprised in a current image capture control parameter fails to meet a pre-determined lighting requirement;
    adjusting at least one image capture control parameter of the shooting scene;
    re-determining, based on an image capture control parameter after being adjusted, lighting information of the partial area; and
    determining, in response to a case if the re-determined lighting information still fails to meet the pre-determined lighting requirement, the determined partial area as the first zone.

19. The computer readable storage apparatus of claim 15, wherein the operations further comprise:

determining, according to at least motion information of a shot object in the shooting scene, the first zone.

20. The computer readable storage apparatus of claim 19, wherein the operations further comprise:
    acquiring motion information of a shot object in the shooting scene;
    determining, according to the motion information, a motion distance of the shot object within a pre-determined image capture duration; and
    determining a zone that corresponds to the motion distance in the shooting scene as the first zone.

21. The computer readable storage apparatus of claim 20, wherein the operations further comprise:
    determining a relative displacement of a motion distance relative to the image sensor; and
    comparing the relative displacement with an allowable displacement; and
    determining, in response to a case if the relative displacement exceeds the allowable displacement, a zone that corresponds to the motion distance as the first zone.

22. The computer readable storage apparatus of claim 20, wherein the operations further comprise:
    adjusting, in response to a case if imaging quality of a zone that corresponds to the motion distance fails to meet a pre-determined imaging quality requirement under current image capture control, at least one image capture control parameter of the shooting scene;
    re-determining, based on an image capture control parameter after being adjusted, imaging quality of the zone that corresponds to the motion distance; and
    determining, in response to a case if the re-determined imaging quality still fails to meet the pre-determined imaging quality requirement, the determined partial area as the first zone.

23. The computer readable storage apparatus of claim 20, wherein the operations further comprise:
    receiving motion information of the shot object.

24. The computer readable storage apparatus of claim 20, wherein the operations further comprise:
    analyzing a preview image of the shooting scene; and
    acquiring, according to an analysis result, motion information of the shot object.

25. The computer readable storage apparatus of claim 20, wherein the operations further comprise:
    acquiring real-time depth information of the shooting scene; and
    acquiring, according to the real-time depth information, motion information of the shot object.

26. The computer readable storage apparatus of claim 15, wherein the operations further comprise:
    determining target pixel density distribution information of the image sensor, wherein a first target pixel density of the first imaging region is lower than a second target pixel density of the second imaging region in the target pixel density distribution information; and
    adjusting pixel density distributions of the image sensor according to the target pixel density distribution information.

27. The computer readable storage apparatus of claim 26, wherein the operations further comprise:
    determining according to the target pixel density distribution information, deformation control information of a controllably-deformable material part of the image sensor; and
    controlling, according to the deformation control information, the controllably-deformable material part to deform, so as to accordingly adjust pixel density distributions of the image sensor.

28. An image capture control apparatus, characterized by comprising a processor and a memory, the memory storing computer executable instructions, the processor being connected to the memory through a communication bus, and when the apparatus for controlling task migration operates, the processor executing the computer executable instructions stored in the memory, so that the apparatus for controlling task migration executes operations, comprising:
    determining a first zone as an allowable image blur zone, the first zone being a part of a shooting scene;
    determining a first imaging region that corresponds to the allowable image blur zone in an image sensor;
    adjusting pixel density distributions of the image sensor, to cause a first pixel density of the first imaging region to be lower than a second pixel density of a second imaging region in the image sensor after being adjusted; and
    performing, by using the image sensor after being adjusted, image capture on the shooting scene.

* * * * *